(12) United States Patent
Feldmeyer

(10) Patent No.: US 6,311,941 B1
(45) Date of Patent: Nov. 6, 2001

(54) ANTI-TIP DEVICE

(75) Inventor: Mark D. Feldmeyer, San Jose, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/363,969

(22) Filed: Jul. 29, 1999

(51) Int. Cl.[7] .................................................. A47B 91/00
(52) U.S. Cl. .................................. 248/188.8; 248/188.9; 248/677; 312/351.9
(58) Field of Search .................. 248/188.8, 188.1, 248/222.51, 292.12, 292.13, 346.04, 678, 918, 289.11, 653, 456, 649, 188.9, 677, 188.91; 312/351.9, 351.3; 108/7, 9; 400/682; 403/93

(56) References Cited

U.S. PATENT DOCUMENTS

| | | | |
|---|---|---|---|
| 3,811,715 | * | 5/1974 | Brudy ...................................... 403/93 |
| 4,449,969 | * | 5/1984 | Schweizer ............................ 248/528 |
| 4,785,190 | * | 11/1988 | Frankena ............................ 250/503.1 |
| 4,955,873 | * | 9/1990 | Rajlevsky .......................... 248/188.6 |
| 5,109,572 | * | 5/1992 | Park ........................................ 16/334 |
| 5,297,003 | * | 3/1994 | Nomura et al. ...................... 361/680 |
| 5,601,541 | * | 2/1997 | Swisher .............................. 248/188.7 |
| 5,865,408 | * | 2/1999 | Swisher .............................. 248/188.2 |
| 5,887,962 | * | 3/1999 | Tsai ...................................... 248/677 |
| 5,911,393 | * | 6/1999 | Reuter ................................. 248/181.1 |
| 5,934,774 | * | 8/1999 | Wu et al. .............................. 248/688 |

OTHER PUBLICATIONS http://www.in-win.com/icon/q500mec.jpg, pp. 1 of 1.
http://www.in-win.com/framecode/ino$_{13}$q600.html, pp. 1 of 1.

* cited by examiner

*Primary Examiner*—Anita King
*Assistant Examiner*—Gwendolyn Baxter
(74) *Attorney, Agent, or Firm*—Clare T. Hartnett

(57) ABSTRACT

An anti-tip device for a computer tower chassis. The anti-tip device includes a hub and a base foot that is mounted to the bottom surface of a tower chassis. The hub is fitted into an interior cavity of the base foot and provides the base foot with a foundation around which the base foot rotates. The hub itself is mounted to the tower chassis through a set of pins that ensure that the hub is kept stationary. The base foot includes an elongated foot and cavity for housing the hub. The interior circumference of the cavity includes a number of detents that define positions of the base foot. The hub includes a spring mechanism including a knob that is fitted to snap into a detent. As the base foot is rotated, the rotational force decompresses the spring so that it rides on the outer surface of the interior circumference of the base foot. When the spring mechanism encounters a detent, the spring mechanism compresses and forces the knob to snap into the detent thereby securely placing the base foot into the desired position.

10 Claims, 11 Drawing Sheets

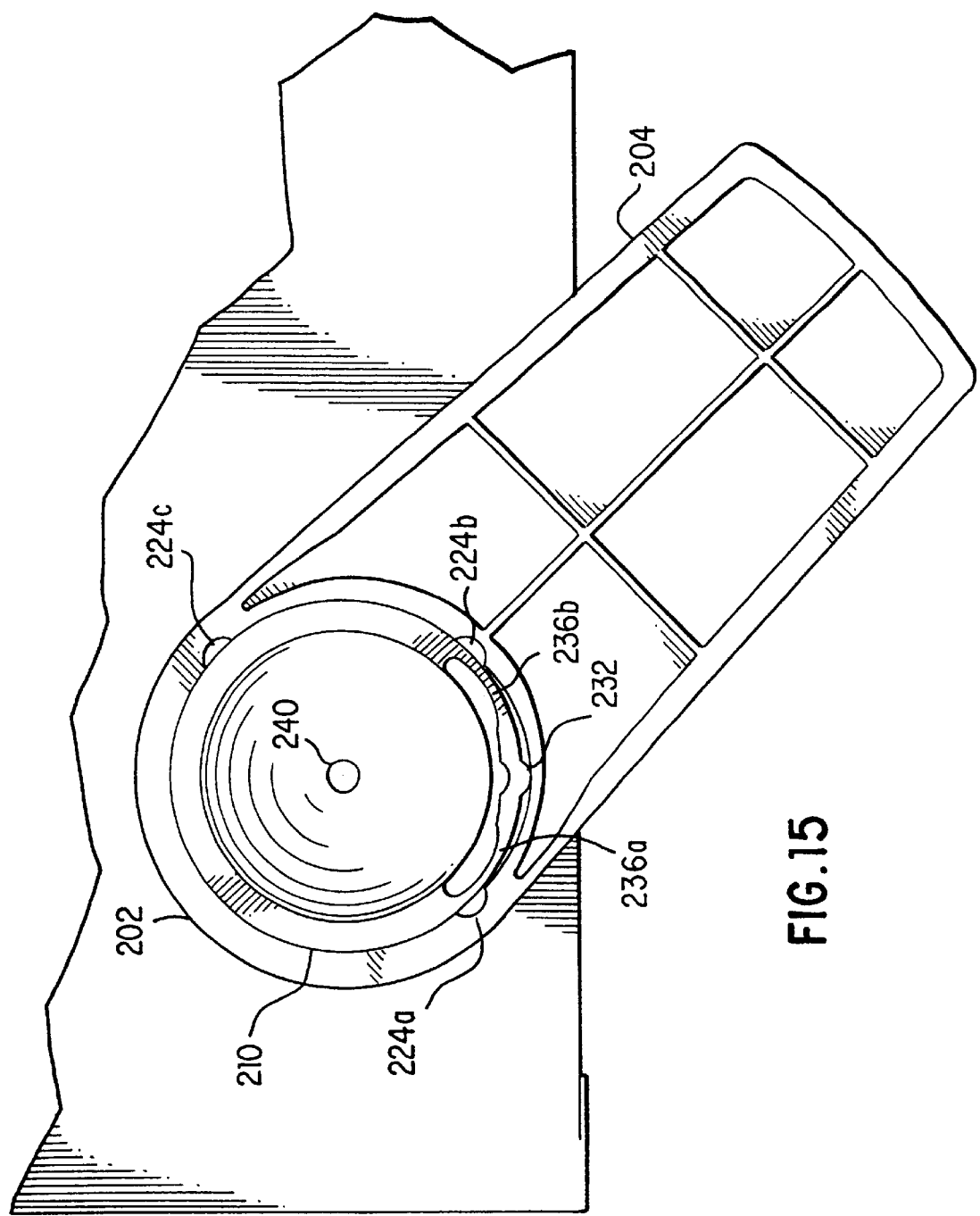

ANTI-TIP DEVICE

FIELD OF THE INVENTION

The present invention relates generally to computer systems. More particularly, the invention relates to a mechanism that improves the stability of towerlike chassises.

BACKGROUND OF THE INVENTION

A trend in the computer industry is the use of a tower chassis to house a computer system's electrical components and associated devices. The tower chassis is characterized by a vertical cabinet that can be positioned off a desk top thereby providing the user with additional desk top space. Although the vertical nature of the tower chassis is beneficial in this respect, at times the height of the tower chassis can make it subject to occasional instability problems, such as rocking and tipping. For this reason, some tower chassises are equipped with tip prevention devices.

One such tip prevention device 100 is illustrated in FIG. 1. There is shown a tip prevention device 100 that can be mounted to the bottom surface of a tower chassis. Typically, two such tip prevention devices 100 are mounted to the tower chassis. A first tip prevention device 100 is mounted at the front of the bottom surface and a second tip prevention device 100 is mounted at the rear of the bottom surface.

The tip prevention device 100 is fabricated of plastic parts including a base bar 102 and two anti-tip feet 104a–104b. At each end of the base bar 102, there is a slot 106a–106b that houses an anti-tip foot 104. The anti-tip foot 104 rotates about an axis within the slot 106 so that the anti-tip foot 104 can be placed in a number of positions. The anti-tip foot 104 has a cylindrical-shaped head 108 including a number of detents 110a–110h spaced around the head 108. Each slot 106 includes two springs 112, where each spring 112 includes a knob 114. When the head 108 is rotated within a slot 106, each spring 112 is depressed so that its respective knob 114 rides on the outer surface of the head 108 until both knobs 114 fall into the desired detents 110. The detents 110 on the head 108 and the springs 112 are spaced so that when a knob 114 fits into a detent 110, the anti-tip foot 104 is positioned at either a 0, 45 or 90 degree angle angular position.

The tip prevention device 100 described above has several drawbacks. First, the device is dependent on the base bar 102 that is specifically configured to the dimensions of the tower chassis. The use of the device 100 for other chassises may require that the base bar 102 be tailored to the dimensions of a particular chassis. In addition, the rotation of the tip prevention device 100 is limited to a certain range so that it can be only placed in one of three specific positions. At times, it may be desirable to rotate the device in a different orientation in order to achieve a desired position. Another disadvantage is that the device 100 utilizes large plastic parts which increases the overall cost of the device 100. Accordingly, there is a need for a tip prevention device that can overcome these shortcomings.

SUMMARY OF THE INVENTION

The present invention pertains to an anti-tip device or tip prevention device that can be used with a tower chassis of a computer system. The anti-tip device includes a hub and a base foot that is assembled and then mounted to the bottom surface of the tower chassis. Any number of anti-tip devices can be positioned on the bottom surface and in any configuration. In one such configuration, four anti-tip devices are mounted to each corner of the bottom surface of the tower chassis.

The anti-tip device rotates about an axis so that the device can be placed in one of a number of positions. In a first position, the anti-tip foot can be extended outward from the tower chassis in a first direction thereby extending the horizontal base of the tower chassis. Alternatively, the anti-tip foot can be extended outward from the tower chassis in a second direction that extends the vertical base of the tower chassis. In either of these positions, the stability of the tower chassis is improved against occasional tipping and rocking. In yet another position, the anti-tip foot can be retracted inward.

The anti-tip foot includes a hub and a base foot. The cylindrical-shaped hub is fitted into an interior cavity of the base foot. The hub provides the base foot with a rotational base and includes a spring mechanism that locks into the base foot. The spring mechanism includes a knob that is supported on either side by pressure arms. In addition, the top side of the hub includes a set of pins that are used to mount the hub to the tower chassis and which ensure that the hub is kept stationary.

The base foot includes an elongated foot and a cavity that houses the hub. The interior circumference of the cavity includes a number of detents that are used to place the foot in one of a number of predefined angular positions. As the base foot is rotated, the rotational force decompresses the spring so that it rides on the interior circumference of the cavity. When the spring encounters a detent, the spring expands and snaps into the detent thereby securely placing the base foot into a desired position.

The design of the anti-tip device is advantageous for several reasons. First, the anti-tip device is a simple design consisting of only two main plastic pieces: the hub and the base foot. This simplicity makes the device easy to manufacture and hence, more cost effective.

Furthermore, the mechanical design of the device lends itself to additional benefits. First, the foot can accomplish a full three hundred and sixty degree rotation in either direction. This makes the anti-tip foot a more robust design since the device can be placed in any position on the tower chassis. In addition, the knob of the spring mechanism is supported on either side by pressure arms. As such, the hub only requires a single spring mechanism. Thirdly, the hub rotating about the interior cavity of the base foot minimizes the amount of wear that is placed on the spring mechanism. Furthermore, if the spring mechanism were ever to wear out, it only requires replacement of the hub and not the entire assembly.

BRIEF DESCRIPTION OF THE DRAWINGS

For a better understanding of the nature and objects of the invention, reference should be made to the following detailed description taken in conjunction with the accompanying drawings, which:

FIG. 15 is a bottom view of the anti-tip device in accordance with an embodiment of the present invention.

Like reference numerals refer to corresponding parts throughout the several views of the drawings.

DETAILED DESCRIPTION OF THE INVENTION

Figure 1:
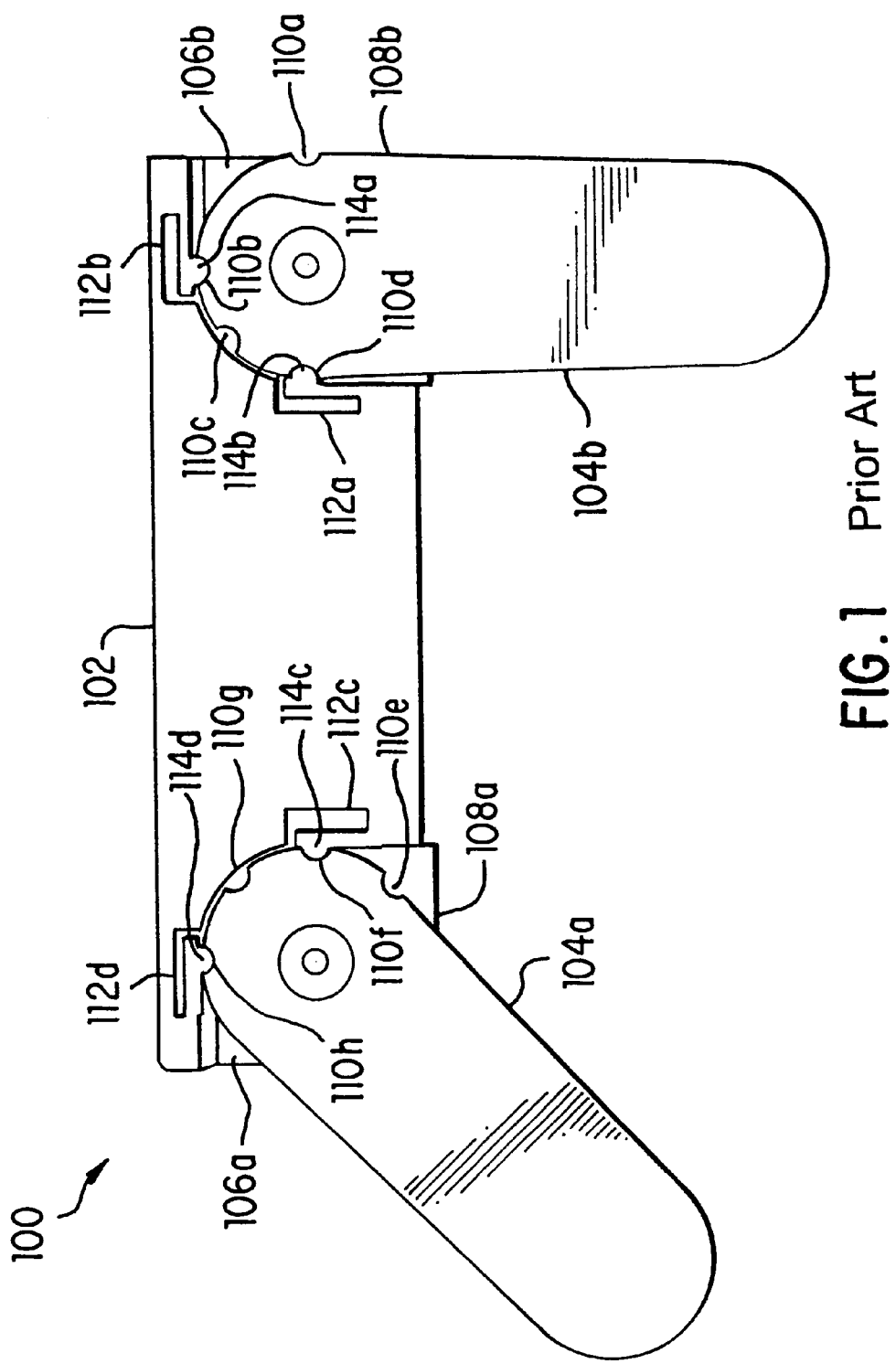
FIG. 1 is a prior art tip prevention device.
Figure 2:
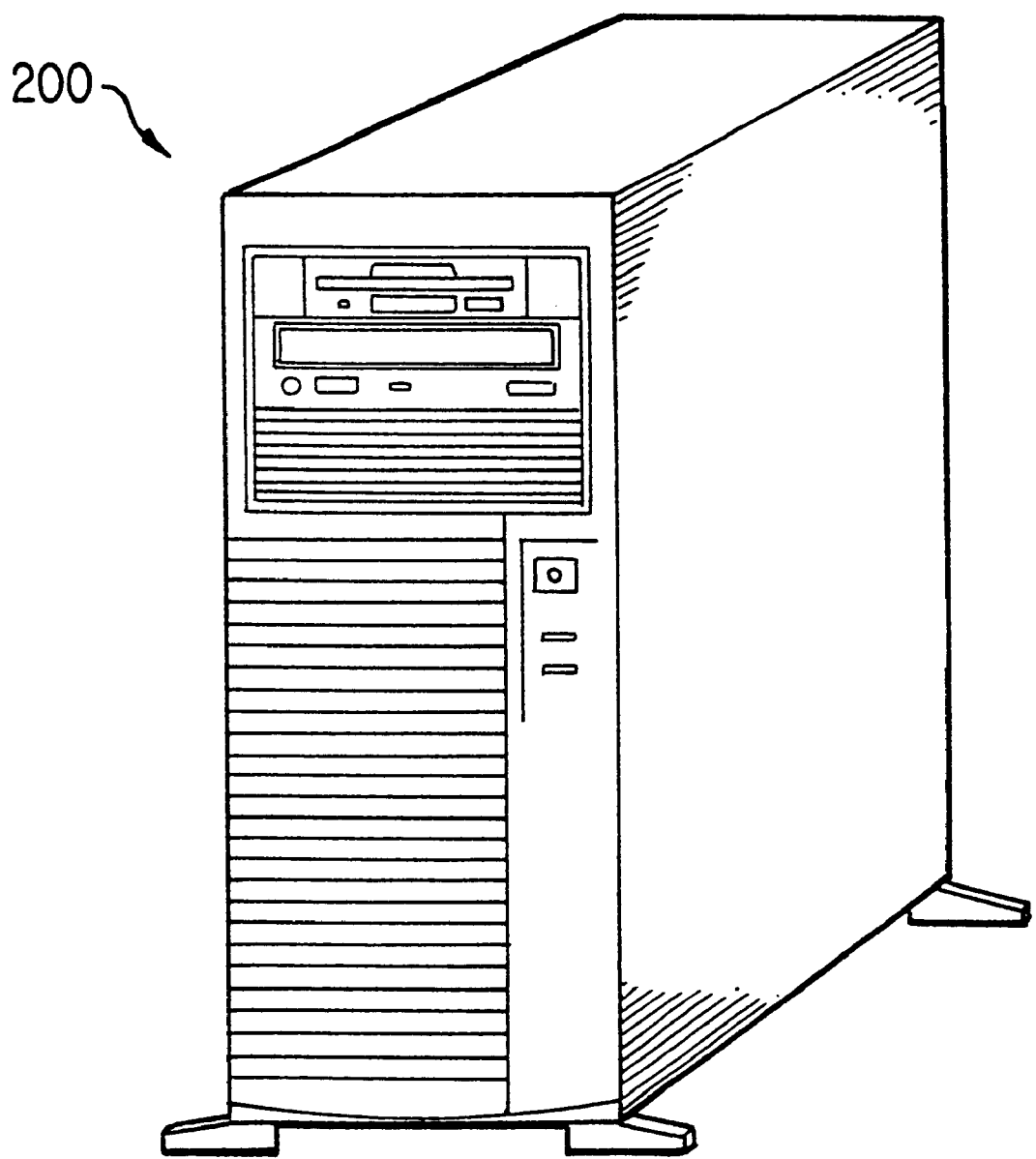
FIG. 2 is a schematic view of an exemplary tower chassis.

FIG. 2 illustrates an exemplary tower chassis 200 that is part of a computer system. The computer system can be a personal computer, workstation, mainframe computer, server system, or the like. The tower chassis 200 provides a user of the computer system with the flexibility of positioning the tower chassis 200 off the desk top and in other places such as the floor or the like. This flexibility gives the user more room on the desk top for larger-sized monitors and other peripheral devices.

Due to the vertical nature of the tower chassis 200, the tower chassis 200 may become unstable. In order to improve the stability of the tower chassis 200, the bottom surface 202 of the tower chassis 200 includes four anti-tip devices or feet 204a–204d. The anti-tip feet 204 extend the horizontal or vertical base of the tower chassis 200 so that the stability of the tower chassis 200 is improved.

Figure 3:
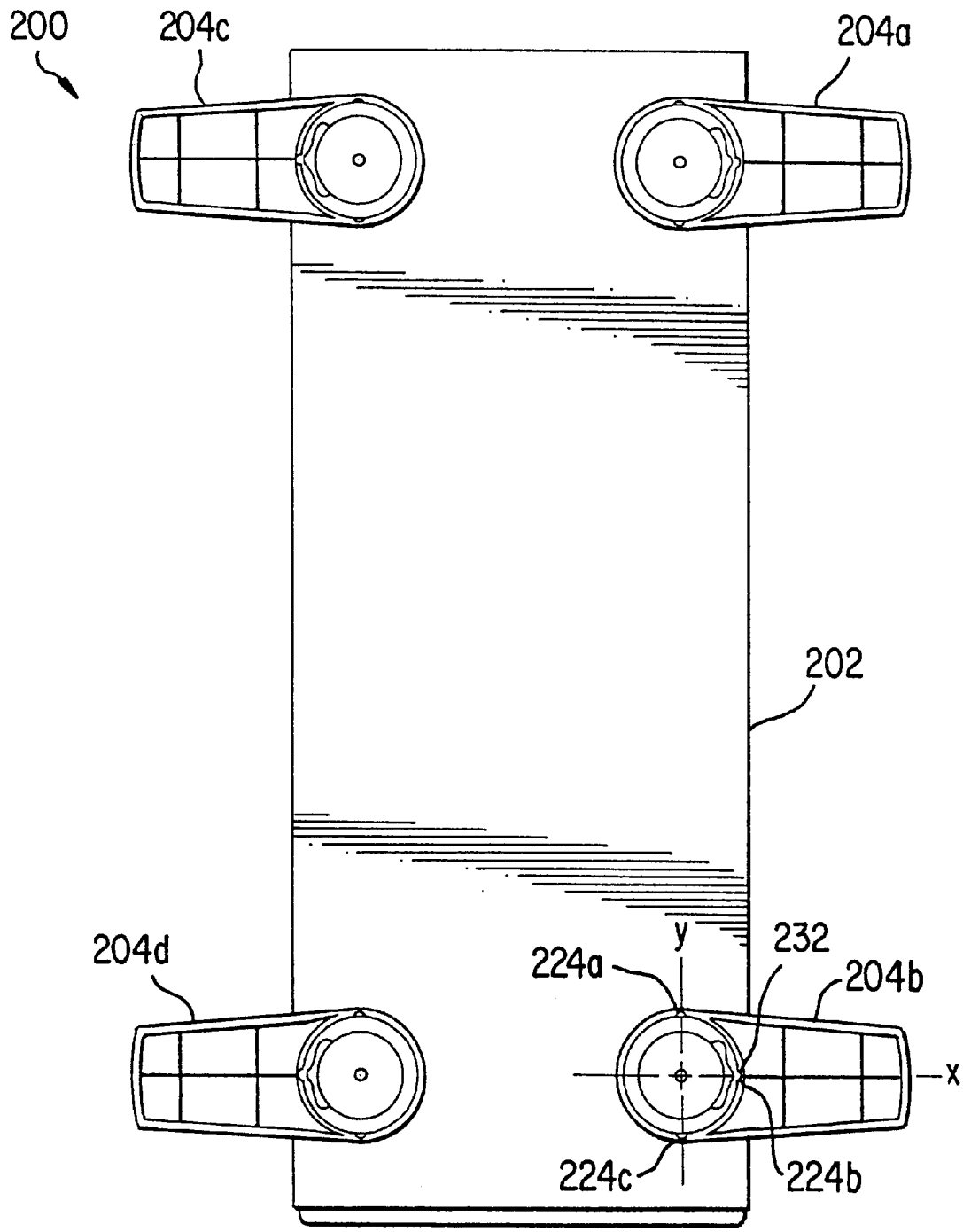
FIG. 3 illustrates four anti-tip devices mounted onto the bottom surface of a tower chassis and which are extended away from the chassis.
Figure 4:
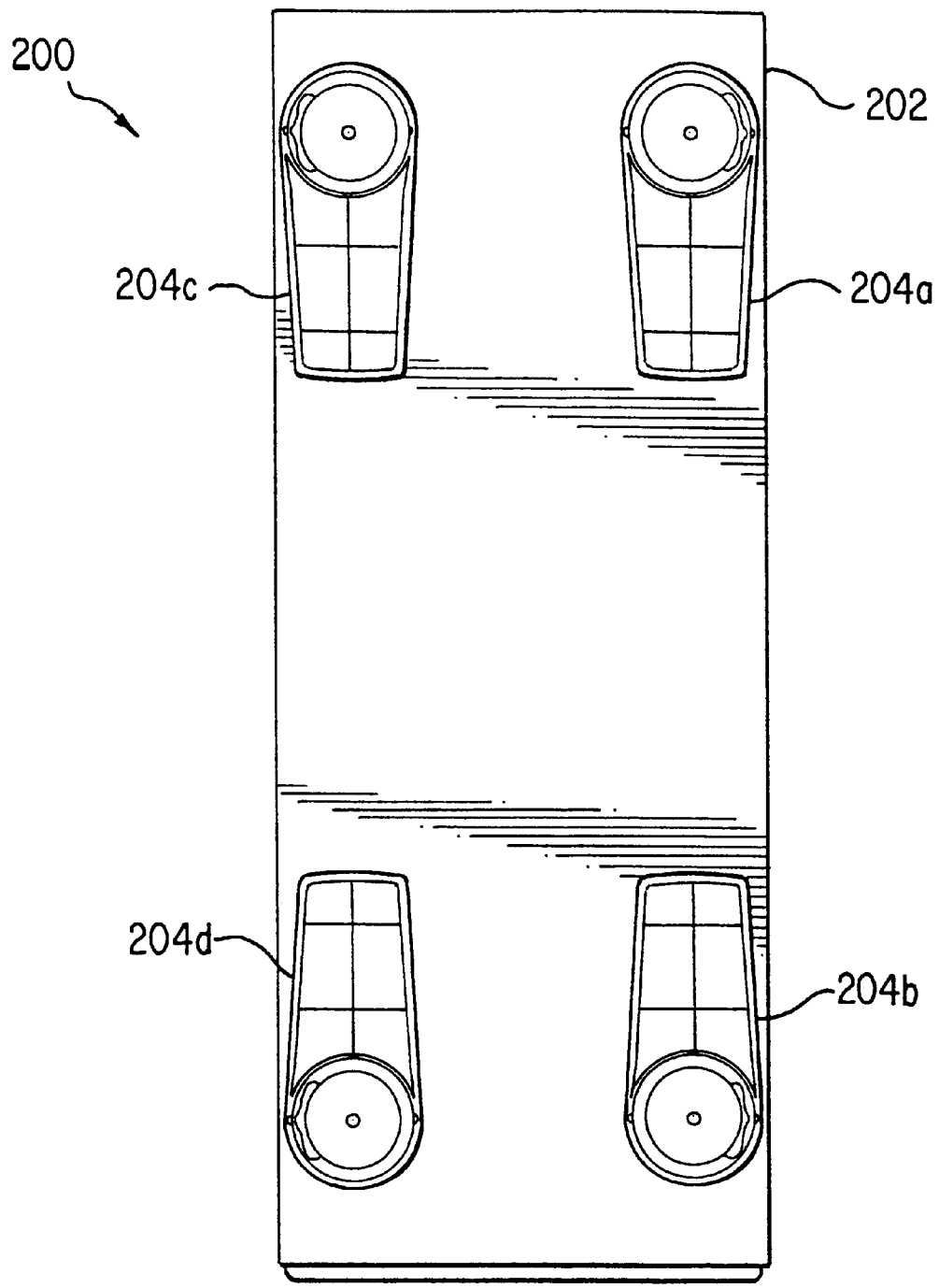
FIG. 4 illustrates four anti-tip devices mounted onto the bottom surface of a tower chassis and which are retracted into the chassis.

As shown in FIGS. 3 and 4, there are four anti-tip feet 204a–204d mounted directly to the bottom surface 202 of the tower chassis 200 at opposite corners. However, it should be noted that the number of anti-tip feet 204 and their placement on the tower chassis 200 is not a limitation of the present invention and that alternate configurations and placements can be utilized.

Each anti-tip foot 204 rotates about an axis 206 (See FIG. 6) so that the anti-tip foot 204 can be placed in any one of a number of positions. FIG. 3 illustrates one such position where each anti-tip foot 204a–204d is rotated about an axis 206 such that the anti-tip foot 204 is extended away from the tower chassis 200. In this position, the anti-tip foot 204 is in essence extending the horizontal base of the tower chassis 200 and hence, providing additional support. FIG. 4 illustrates another position which is typically used when the tower chassis 200 is shipped. In this position, an anti-tip foot 204 is rotated about the axis 206 such that the anti-tip foot 204 is retracted into the tower chassis 200.

Figure 5:
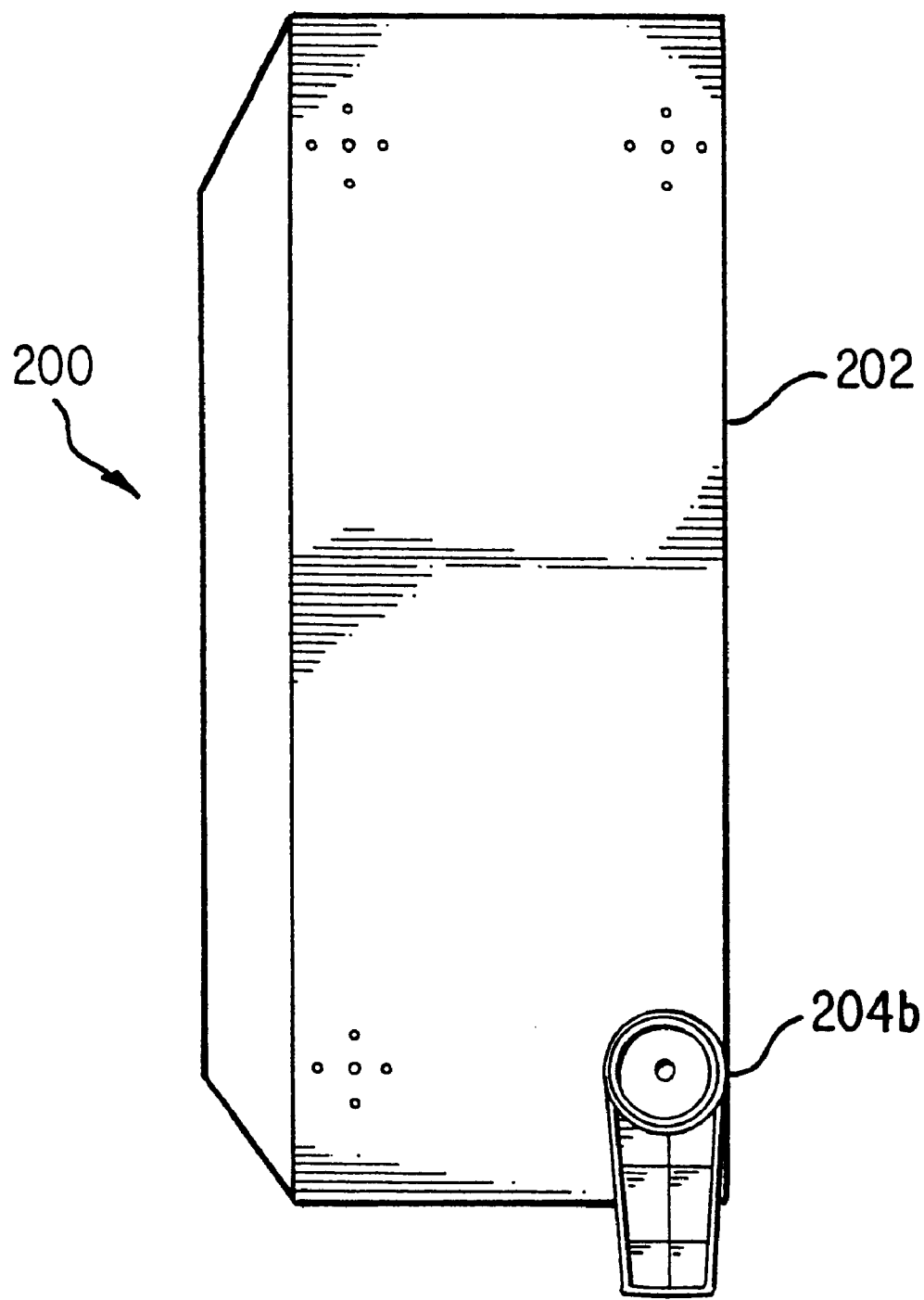
FIG. 5 illustrates an anti-tip device mounted onto the bottom surface of a tower chassis and extended over the front of the chassis.

It should be noted that each foot 204 can be placed in any number of positions and is not limited to those positions shown in FIGS. 3 and 4. For example, if one side of the tower chassis 200 is placed close to a wall, then the two anti-tip feet 204 on the opposite side of the wall can be extended while the two anti-tip feet 204 closest to the wall are retracted. By way of another example FIG. 5 shows an anti-tip foot 204b extended over the front of the tower chassis 200. In this position, the anti-tip foot 204 is extending the vertical base of the tower chassis 200 and hence providing additional stability.

Figure 6:
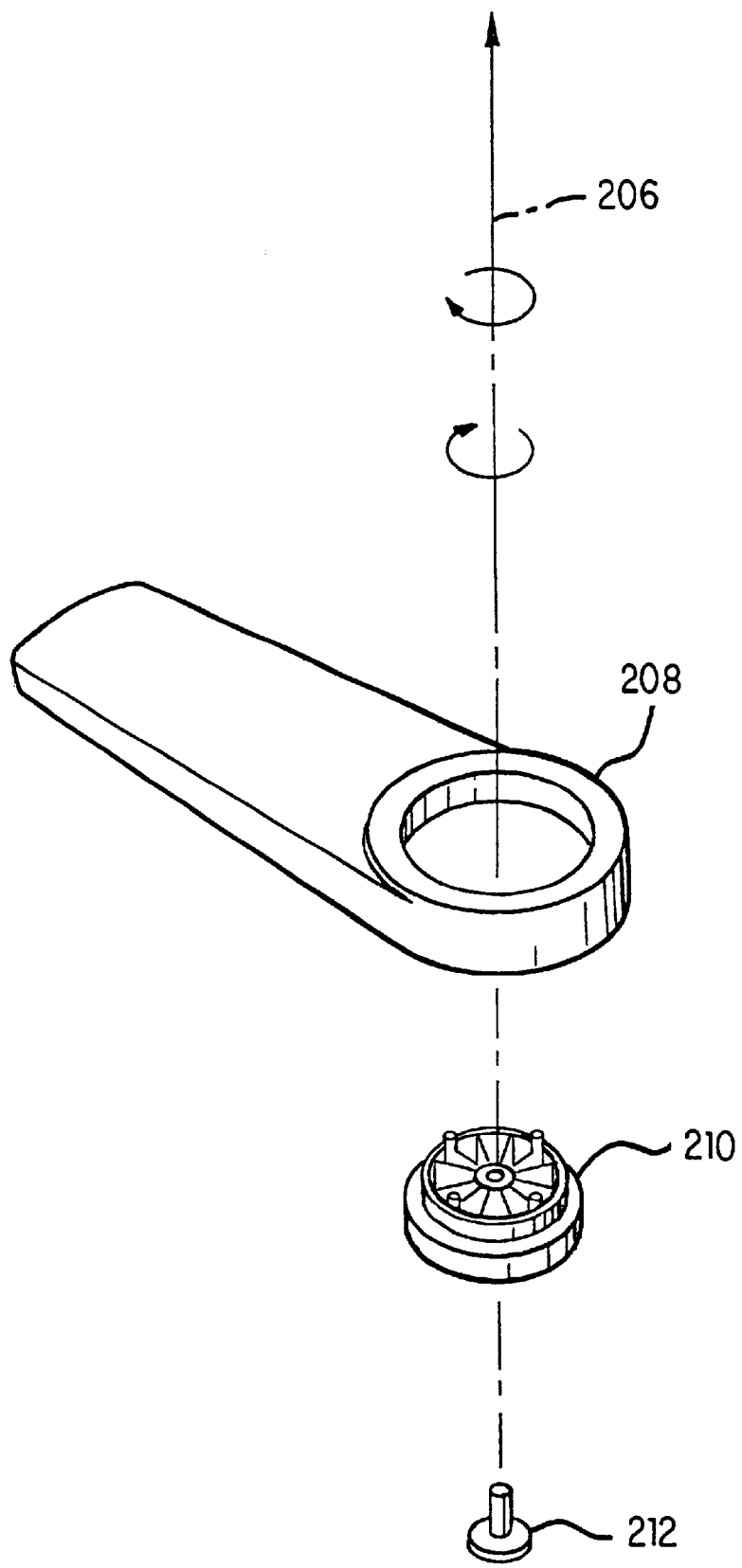
FIG. 6 is an exploded view of the components of the anti-tip device in accordance with embodiment of the present invention.

FIG. 6 illustrates the components of the anti-tip device 204. There is shown a base foot 208, a hub 210, and a screw 212. The base foot 208 provides the extension that maintains the stability of the tower chassis 200. The hub 210 enables the base foot 208 to rotate in any direction and to be securely placed into a number of positions. The hub 210 fits into the base foot 208. The screw 212 is used to secure the hub 210 in the base foot 208 and the assembled hub 210 and base foot 208 to the bottom surface of the tower chassis 200.

Figure 7:
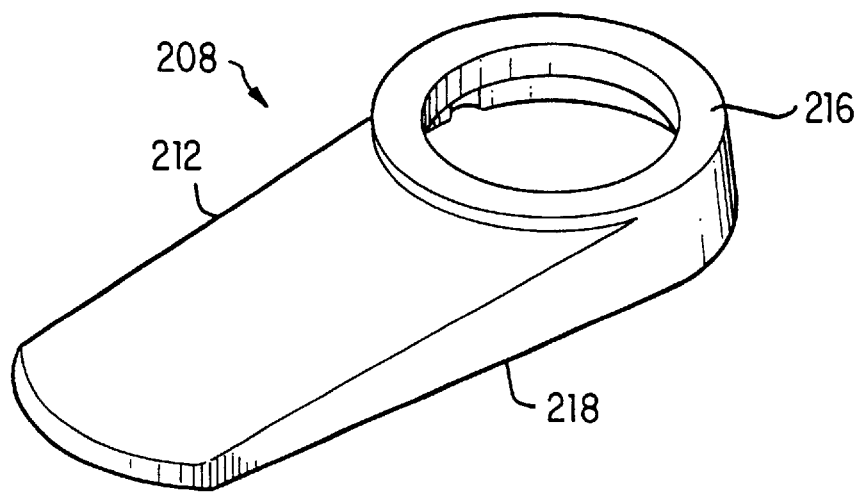
FIG. 7 is a top perspective view of the base foot of the anti-tip device in accordance with an embodiment of the present invention.
Figure 8:
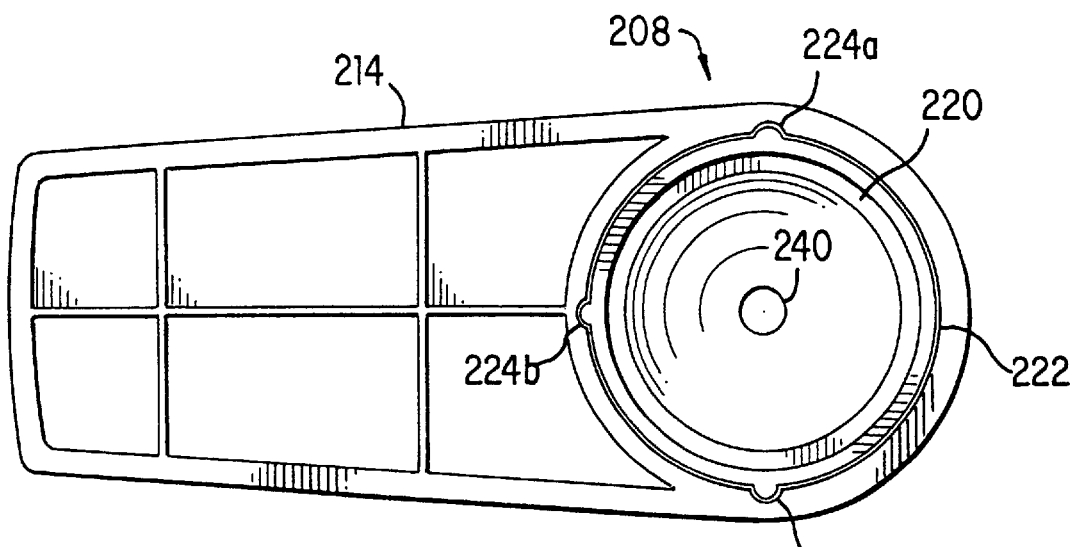
FIG. 8 is a bottom view of the base foot of the anti-tip device in accordance with an embodiment of the present invention.

FIGS. 7–8 illustrate the base foot 208 in more detail. FIG. 7 illustrates the top side 212 of the base foot 208 and FIG. 8 illustrates the bottom side 214 of the base foot 208. The base foot 208 includes a hollow cylindrical base 216 and an elongated foot member 218. The cylindrical base 216 includes two concentric apertures that define two concentric hollow cavities 220, 222. The first cavity 220 has a smaller diameter than the second cavity 222. The inner circumference of the second cavity 222 includes a number of detents that are placed in desired locations. In a first preferred embodiment, there are three detents 224a–224c placed within ninety (90) degree angular increments of each other.

Figure 9:
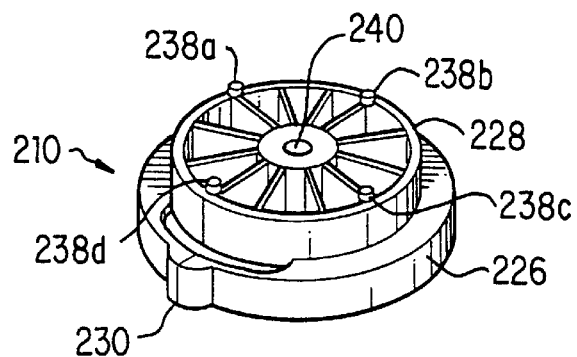
FIG. 9 is a top perspective view of the hub of the anti-tip device in accordance with an embodiment of the present invention.
Figure 10:
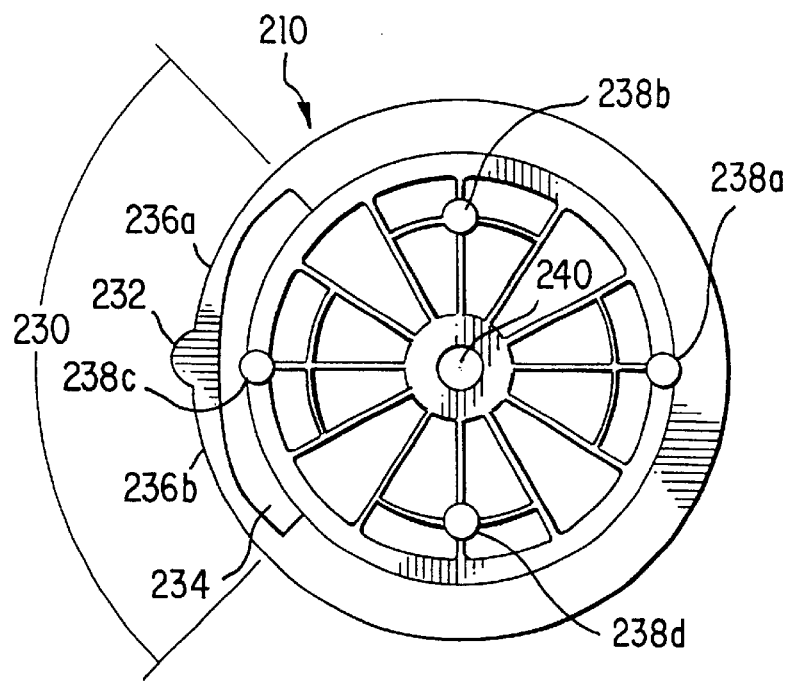
FIG. 10 is a top view of the hub of the anti-tip device in accordance with an embodiment of the present invention.
Figure 11:
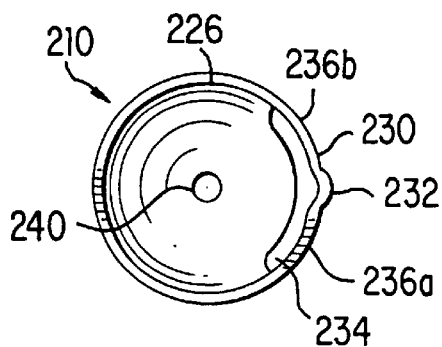
FIG. 11 is a bottom view of the hub of the anti-tip device in accordance with an embodiment present invention.

FIGS. 9–11 illustrate the hub 210 in more detail. The hub 210 takes on a cylindrical shape and includes a bottom member 226 and a top member 228. The bottom member 226 has a larger diameter than the top member 228 and the dimensions of the diameters are selected so that the bottom member 226 fits inside the second cavity 222 of the base foot 208 and the top member 228 fits inside the first cavity 220 of the base foot 208.

The bottom member 226 includes a single spring mechanism 230. The outer surface of the spring mechanism 230 has a knob 232 and the inner surface of the spring mechanism is a hollow cavity 234. On either side of the knob 232, there are pressure arms 236a–236b that enable the spring mechanism 230 to be decompressed in equal proportion. This minimizes the wear on the spring mechanism and also enables the anti-tip device 204 to have a single spring mechanism 230.

The top member 228 includes a number of pins 238a–238d that are used to fit the assembled hub 210 and base foot 208 to the bottom surface 202 of the tower chassis 200 which will be described in more detail below. In addition, the center of the top member 228 has an aperture 240 that is used to fit the screw 212 that mounts the assembled hub 210 and base foot 208 to the tower chassis 200.

Figure 12:
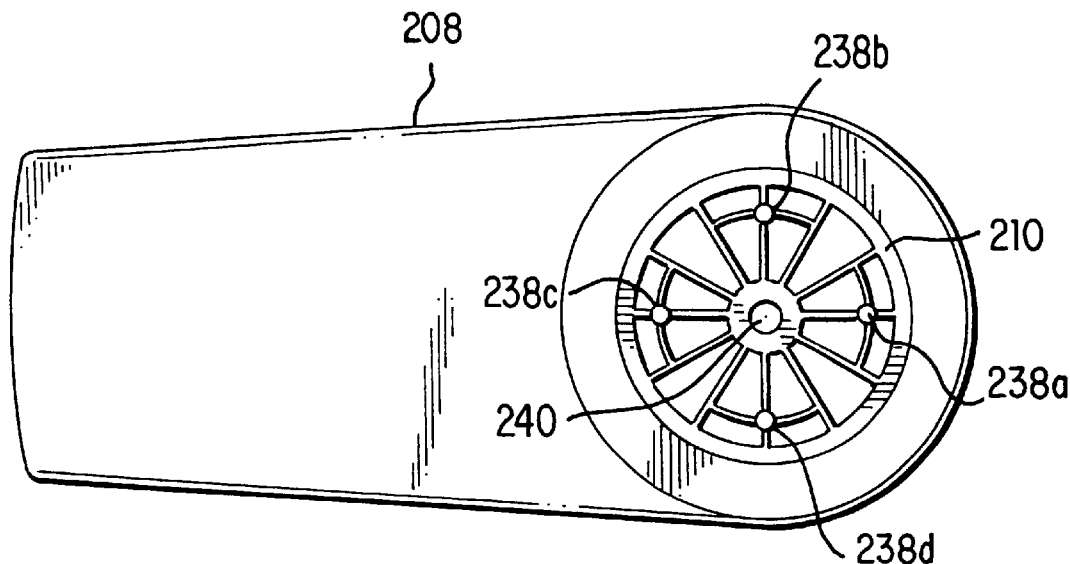
FIG. 12 is a top view of the base foot assembled with the hub in accordance with an embodiment of the present invention.
Figure 13:
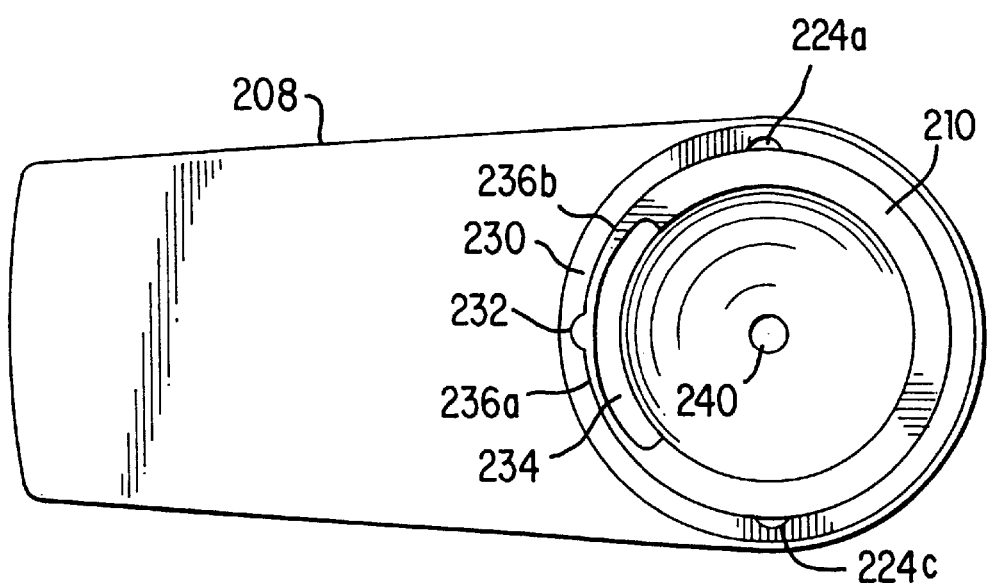
FIG. 13 is a bottom view of the base foot assembled with the hub in accordance wit embodiment of the present invention.

FIGS. 12–13 illustrate the placement of the hub 210 inside the base foot 208. As shown in FIG. 12, the top member 228 of the hub 210 fits and extends through the first cavity 220 of the base foot 208. The pins 238 of the top member 228 are exposed and then fitted into a respective slot on the bottom surface 202 of the tower chassis 200.

Figure 14:
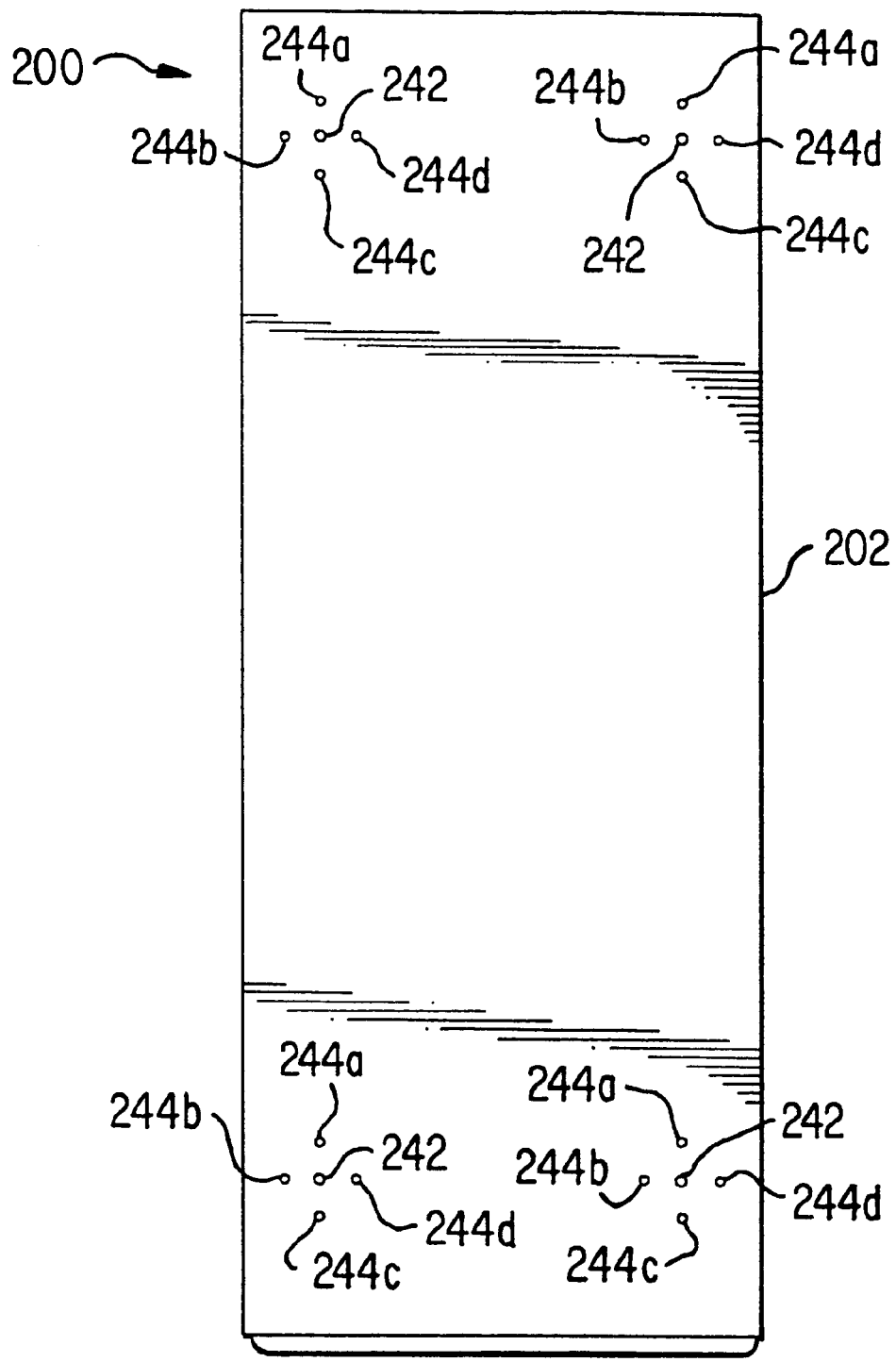
FIG. 14 is a top view of the bottom surface of a tower chassis in accordance with an embodiment of the present invention.

As shown in FIG. 14, the bottom surface 202 of the tower chassis 200 has a set of mounting apertures. Each set of mounting apertures includes an aperture 242 for the screw 212 that secures the assembled hub 210 and base foot 208 to the tower chassis 200. In addition, there are four additional apertures 244a–244d that house each pin 238 on the hub 210. The placement of a pin 238 in its respective aperture 244 ensures that the hub 210 does not rotate when the base foot 208 is moved. Preferably, the pins 238 are spaced equidistant around the aperture 242 that houses the screw 212.

FIG. 13 illustrates the bottom side of the assembled hub 210 and base foot 208. The bottom member of the hub 210 fits into the second cavity 222 of the base foot 208. As shown, when the spring mechanism is not compressed, the knob fits into a detent. When the spring mechanism is compressed, the pressure arms are deflected and the knob rides on the outer surface of the second cavity 222

The operation of the anti-tip device 204 is as follows. The hub 210 is steadfastly positioned to the tower chassis 200 and remains intact. The placement of the knob 232 of the spring mechanism 230 and the angular positions of the detents 224 define the positions of the anti-tip device 204. For example, as shown in FIG. 3 with respect to anti-tip foot 204b, the knob 232 of the spring mechanism 230 is positioned along a direction that extends outward from the chassis 200 along the x-axis superimposed thereon. When the detents 224 are positioned at ninety degree angular increments, the base foot 208 can then be placed in the three positions shown in FIGS. 3–5. One skilled in the art can easily modify the placement of the hub 210 and/or the angular placement of the detents 224 to achieve other foot placements.

Once the hub 210 is fastened to the tower chassis 200, the base foot 208 is rotated around the hub 210. As rotational force is applied to the base foot 208, both pressure arms 236 of the spring mechanism 230 are contracted inward thereby compressing the spring mechanism 230 as shown in FIG. 15. The compressed spring mechanism 230 rides on the surface of the second cavity 222 until the knob 232 expands and snaps into a detent 224 on the second cavity 222 as shown in FIG. 3.

The foregoing description has described the mechanical design and operation of the ant-tip device 204. The design of the anti-tip device 204 is advantageous for several reasons. First, the anti-tip device 204 is a simple design consisting of only two main plastic pieces: the hub 210 and the base foot 208. This simplicity makes the device easy to manufacture and hence, more cost effective.

Furthermore, the mechanical design of the device 204 lends itself to additional benefits. First, the foot 208 can accomplish a full three hundred and sixty degree rotation in either direction. This makes the anti-tip foot 208 a more robust design since the device 204 can be placed in any position on the tower chassis 200. In addition, the knob 232 of the spring mechanism 230 is supported on either side by pressure arms 236. As such, the hub 210 only requires a single spring mechanism 230. Thirdly, the hub 210 rotating about the interior cavity of the base foot 208 minimizes the amount of wear that is placed on the spring mechanism 230. Furthermore, if the spring mechanism 230 were ever to wear out, it only requires replacement of the hub 210 and not the entire assembly.

The foregoing description, for purposes of explanation, used specific nomenclature to provide a thorough understanding of the invention. However, it will be apparent to one skilled in the art that the specific details are not required in order to practice the invention. In other instances, well known structures and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

In particular, one skilled in the art can use or easily modify the anti-tip mechanism described herein for use with other types of devices, other than computer systems.

What is claimed is:

1. A tip prevention apparatus, comprising:
    a base foot including a first cavity having a first detent member;
    a hub that is housed in the first cavity, the hub including a spring mechanism including a knob shaped to fit into the first detent member; and
    an axis for rotating the first detent member of the base foot into the knob of the spring mechanism.

2. The apparatus of claim 1, comprising:
    the hub including a mounting member for mounting the tip prevention apparatus to a device having a planar surface.

3. The apparatus of claim 2, comprising:
    the planar surface including a plurality of apertures; and
    the hub including a plurality of pins, each pin fitted into a corresponding one of the apertures.

4. The apparatus of claim 3, comprising:
    the base foot including a second cavity that is concentric to the first cavity; and
    the hub including a top member and a bottom member, the top member including the plurality of pins, the top member housed in the second cavity.

5. The apparatus of claim 1,
    the spring mechanism including a first and second pressure arm members, the first pressure arm member positioned on a first side of the knob and the second pressure arm member positioned on a second side of the knob, the first and second pressure arms enable the spring mechanism to compress when force is applied to the spring mechanism and to spring when the force is relieved from the spring mechanism.

6. The apparatus of claim 1,
    the base member including an elongated foot.

7. The apparatus of claim 1,
    the hub including a second detent placed at an angular position relative to the first detent.

8. A method for stabilizing a computer chassis, said method comprising the steps of:
    providing a base and a hub, the base including a first cavity and a foot member, the first cavity including a first detent, the hub including a spring mechanism;
    inserting the hub inside the first cavity;
    mounting the hub to a planar surface;
    rotating the foot member along the hub;
    compressing the spring mechanism; and
    expanding the spring mechanism into the first detent.

9. The method of claim 8, comprising the steps of:
    providing a second detent on the first cavity;

rotating the foot member along the hub;
compressing the spring mechanism; and
expanding the spring mechanism into the second detent.

10. The method of claim 8, comprising the steps of:
providing the spring mechanism with a knob, a first pressure arm member, and a second pressure arm member;

the compressing step further comprising the step of:
contracting the first and second pressure arm members;
the expanding step further comprising the steps of:
expanding the first and second pressure arm members; and
spring the knob into the first detent.

* * * * *